(12) United States Patent
Prasad

(10) Patent No.: US 9,641,142 B2
(45) Date of Patent: May 2, 2017

(54) HOT-SWAP CURRENT-SENSING SYSTEM

(71) Applicant: TEXAS INSTRUMENTS INCORPORATED, Dallas, TX (US)

(72) Inventor: Sudheer Prasad, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 14/965,588

(22) Filed: Dec. 10, 2015

(65) Prior Publication Data

US 2016/0173041 A1    Jun. 16, 2016

(30) Foreign Application Priority Data

Dec. 11, 2014  (IN) .......................... 6249/CHE/2014

(51) Int. Cl.
*H03F 3/393* (2006.01)
*H03F 3/45* (2006.01)
*H03F 1/08* (2006.01)

(52) U.S. Cl.
CPC ............. *H03F 3/393* (2013.01); *H03F 1/086* (2013.01); *H03F 3/45475* (2013.01); *H03F 3/45977* (2013.01); *H03F 2200/252* (2013.01); *H03F 2200/267* (2013.01); *H03F 2200/271* (2013.01); *H03F 2200/297* (2013.01); *H03F 2200/471* (2013.01); *H03F 2203/45151* (2013.01); *H03F 2203/45212* (2013.01); *H03F 2203/45264* (2013.01); *H03F 2203/45288* (2013.01)

(58) Field of Classification Search
CPC .................................................. H03F 3/45892
USPC ...................................... 330/9; 327/124, 307
See application file for complete search history.

(56) References Cited

U.S. PATENT DOCUMENTS 7,292,095 B2    11/2007  Burt et al.

*Primary Examiner* — Henry Choe
(74) *Attorney, Agent, or Firm* — William B. Kempler; Charles A. Brill; Frank D. Cimino

(57) ABSTRACT

One example includes a hot-swap control system. The system includes a sense resistor network provides a sense voltage in response to an output current. The system also includes a sense control circuit includes a chopper amplifier system arranged in a servo feedback arrangement to generate a monitoring voltage having an amplitude that is associated with the output current based on the sense voltage. A notch filter chopping stage filters out signal ripple in the chopper amplifier system across a unity-gain bandwidth of the chopper amplifier system, and a capacitive compensation network provides stability-compensation of the chopper amplifier system across the unity-gain bandwidth. A transconductance amplifier configured to compare the monitoring voltage with a predetermined reference voltage to generate a control voltage. The system further includes a power transistor configured to conduct the output current to an output based on the control voltage.

20 Claims, 3 Drawing Sheets

HOT-SWAP CURRENT-SENSING SYSTEM

CROSS-REFERENCE TO RELATED APPLICATION

This application claims the benefit of Indian Provisional Application No. 6249/CHE/2014, filed 11 Dec. 2014, which is incorporated herein in its entirety.

TECHNICAL FIELD

This disclosure relates generally to electronic systems, and more specifically to a hot-swap control system.

BACKGROUND

Hot-swap systems can be implemented to add or replace components to a computer or electrical system without significant interruption to the system. Hot-swap systems can be implemented in a variety of electrical applications, such as for attaching communication systems (e.g., universal serial bus (USB)). Hot-swap controllers can be used to limit inrush current and to monitor load current in hot plug-in systems, such as connecting computer boards while power is applied on a shared bus. Such hot-swap controllers may require accurate current sensing to ensure proper management of output current amplitudes. As an example, the output current can be sensed across a sense resistor and controlled via a sense amplifier. To substantially mitigate power loss via the sense resistor, the sense resistor can be very small to provide a likewise very small sense voltage. As a result, the sense amplifier can likewise have a very low offset, such as achieved through a chopper amplifier.

SUMMARY

One example includes a hot-swap control system. The system includes a sense resistor network provides a sense voltage in response to an output current. The system also includes a sense control circuit includes a chopper amplifier system arranged in a servo feedback arrangement to generate a monitoring voltage having an amplitude that is associated with the output current based on the sense voltage. A notch filter chopping stage filters out signal ripple in the chopper amplifier system, and a capacitive compensation network arranged with respect to the notch filter chopping stage comprising a first capacitor and a second capacitor arranged in separate respective feedback paths with respect to the notch filter chopping stage and which have a ratio of capacitance values tuned to provide unity-gain stability-compensation of the chopper amplifier system. A transconductance amplifier configured to compare the monitoring voltage with a predetermined reference voltage to generate a control voltage. The system further includes a power transistor configured to conduct the output current to an output based on the control voltage.

Another example includes a hot-swap control system. The system includes a sense resistor network configured to provide a sense voltage in response to an output current. The system also includes a chopper amplifier system arranged in a servo feedback arrangement to generate a monitoring voltage having an amplitude that is associated with an amplitude of the output current based on the sense voltage. The system also includes a transconductance amplifier configured to compare the monitoring voltage with a predetermined reference voltage to generate a control voltage. The system also includes a power transistor configured to conduct the output current from an output terminal of the power transistor to an output based on the control voltage being provided to a control terminal of the power transistor. The system further includes a capacitive coupling between the control terminal and the output terminal of the power transistor.

Another example includes an integrated circuit (IC) chip. The IC chip includes a chopper amplifier system arranged in a servo feedback arrangement to generate a monitoring voltage having an amplitude that is associated with an amplitude of an output current based on a sense voltage. The chopper amplifier system includes a notch filter chopping stage arranged to filter out signal ripple in the chopper amplifier system. The chopper amplifier further includes a capacitive compensation network arranged with respect to the notch filter chopping stage comprising a first capacitor and a second capacitor arranged in separate respective feedback paths with respect to the notch filter chopping stage and which have a ratio of capacitance values tuned to provide unity-gain stability-compensation of the chopper amplifier system. The IC chip also includes a transconductance amplifier configured to compare the monitoring voltage with a predetermined reference voltage to generate a control voltage that is provided to control a power transistor to control an amplitude of the output current. The IC chip further includes a first sense pin and a second sense pin coupled to a sense resistor network configured to provide the sense voltage in response to the output current. The sense resistor network includes a sense resistor interconnecting the first sense pin and a first node and being configured to conduct the output current to generate the sense voltage. The sense resistor network also includes a gain set resistor interconnecting the first node and the second sense pin. The sense resistor network further includes a stability compensation resistor interconnecting the first and second sense pins and having a resistance value that is selected to increase an effective closed-loop gain of the chopper amplifier system with respect to the sense voltage to a value of at least ten.

DETAILED DESCRIPTION

This disclosure relates generally to electronic systems, and more specifically to a hot-swap control system. A hot-swap control system includes a sense resistor network that is configured to generate a sense voltage corresponding to an amplitude of an output current of the hot-swap control system. As an example, the output current flows through a power transistor (e.g., a field-effect transistor (FET)) that provides the output current to a load. The sense voltage can thus be generated as a very small voltage across a sense resistor of the sense resistor network. The sense voltage can thus be provided to a chopper amplifier system that is arranged in a servo feedback arrangement to generate a monitoring voltage (e.g., via a control transistor). As an example, the monitoring voltage can be generated via a monitoring current generated via the control transistor and flowing through a monitoring resistor. The monitoring voltage can be compared with predetermined reference voltage to generate a control voltage that controls the power transistor, and thus the amplitude of the output current.

The chopper amplifier can exhibit a low offset for the amplification of the small sense voltage corresponding to the amplitude of the output current. Thus, the chopper amplifier can achieve amplification of the sense voltage via a high gain for the feedback servo control of the amplitude of the output current. However, the chopper amplifier can have a limited bandwidth that can be unsuitable for hot-swap applications that require a substantially high unity-gain bandwidth. As described herein, unity-gain bandwidth is a bandwidth within which the chopper amplifier has a gain of at least one. Additionally, the chopper amplifier can introduce a ripple in the resulting amplified voltage. Thus, the chopper amplifier can include a notch filter that is configured to filter out the ripple from the amplified voltage. Additionally, the notch filter can include a capacitive compensation arrangement having capacitance values that are tuned to provide unity-gain stabilization of the chopper amplifier system. Such unity-gain stabilization can be effective at high-gain applications of the hot-swap control system, but not for low-gain applications of the hot-swap control system. Therefore, the hot-swap control system can also include an additional stabilization resistor in the sense resistor network that interconnects the inputs of the chopper amplifier, such that the additional stabilization resistor can have a resistance value that is selected to provide a sufficiently low closed-loop bandwidth of the chopper amplifier system. Additionally, the hot-swap control system can include a capacitive coupling associated with the power transistor that is configured to limit the unity-gain bandwidth to substantially increase stability associated with the chopper amplifier system by limiting the unity-gain bandwidth while maintaining accurate sensing of the amplitude of the output current.

Figure 1:
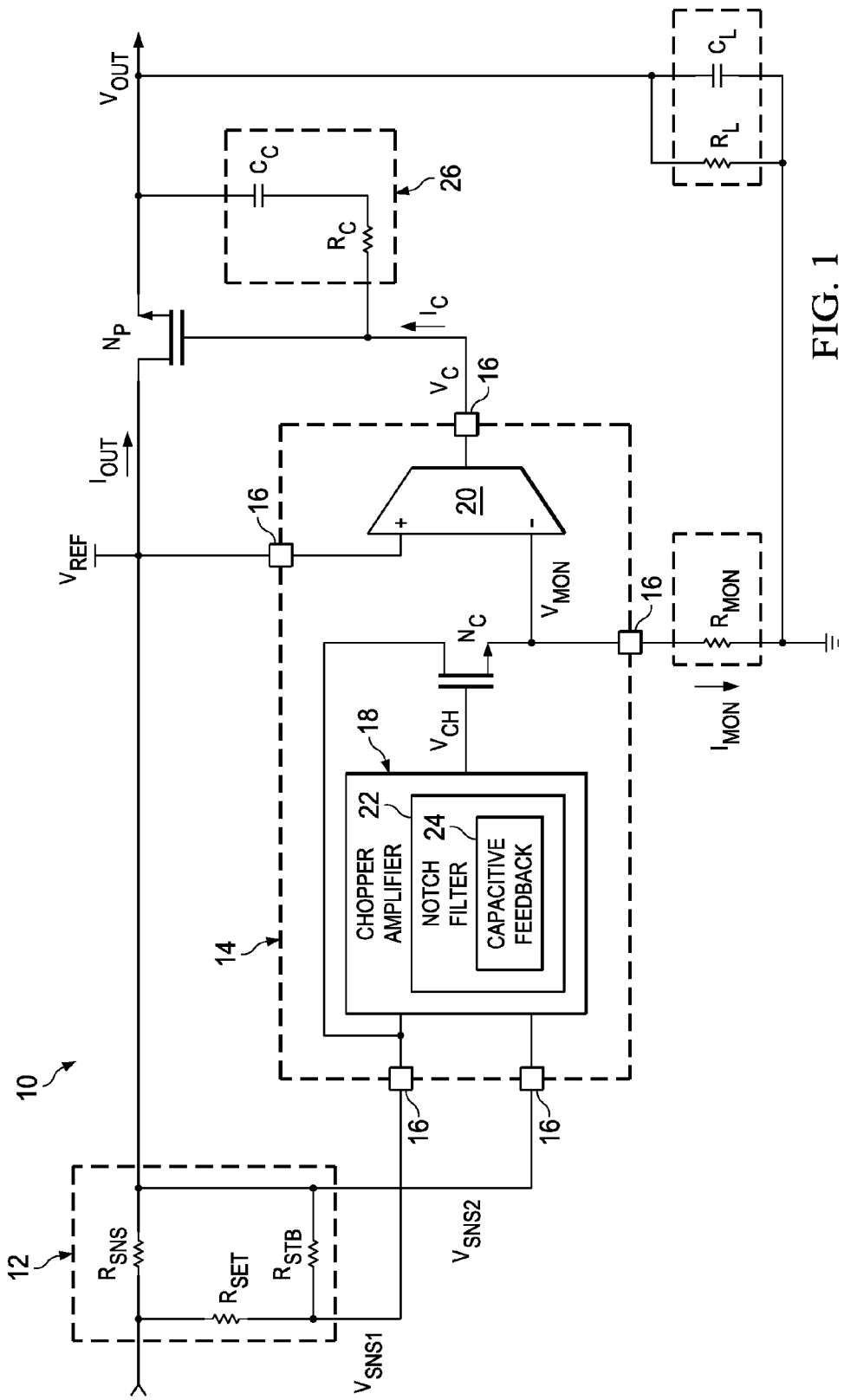
FIG. 1 illustrates an example of a hot-swap control system.

FIG. 1 illustrates an example of a hot-swap control system 10. The hot-swap control system 10 can be implemented in a variety of hot-swap applications, such as communications (e.g., universal serial bus (USB)) based on sensing and controlling an output current $I_{OUT}$. The hot-swap control system 10 includes an N-channel metal-oxide field effect transistor (N-MOSFET), demonstrated as a power transistor $N_P$, that is controlled to provide the output current $I_{OUT}$. The hot-swap control system 10 is configured to sense and control the amplitude of the output current $I_{OUT}$ in a stable and accurate manner over a high unity-gain bandwidth, as described herein.

The hot-swap control system 10 includes a sense resistor network 12 that is configured to generate a sense voltage $V_{SNS}$ corresponding to an amplitude of the output current $I_{OUT}$. In the example of FIG. 1, the sense resistor network 12 includes a sense resistor $R_{SNS}$ through which the output current $I_{OUT}$ flows, a gain set resistor $R_{SET}$, and a stability compensation resistor $R_{STB}$. To substantially maintain efficiency with respect to the output current $I_{OUT}$, the sense resistor $R_{SNS}$ can have a resistance value (e.g., less than one mΩ) that is selected to be very small to provide the sense voltage $V_{SNS}$ at a very small amplitude (e.g., approximately 10 mV). The hot-swap control system 10 also includes a sense controller 14 that is configured to measure the sense voltage $V_{SNS}$ and control the power transistor $N_P$ based on the amplitude of the sense voltage $V_{SNS}$. As an example, the sense controller 14 can be configured as or as a portion of an integrated circuit (IC) chip that includes pins 16 to couple to portions of the hot-swap control system 10 that are external to the sense controller 14.

Because the amplitude of the sense voltage $V_{SNS}$ is small, the sense controller 14 is configured to amplify the sense voltage $V_{SNS}$ in a manner that requires a very low amplifier offset. Therefore, to achieve a very low offset for amplifying the sense voltage $V_{SNS}$, the sense controller 14 includes a chopper amplifier system 18 configured to amplify a differential voltage $V_{SNS}1$ and $V_{SNS}2$ corresponding to the voltage $V_{SNS}$ to generate an amplified voltage $V_{CH}$. In the example of FIG. 1, the chopper amplifier system 18 is arranged in a feedback arrangement to generate the amplified voltage $V_{CH}$ that is provided to a gate of an N-channel MOSFET, demonstrated as a control transistor $N_C$, having a drain that is coupled to the voltage $V_{SNS}1$ and a source that is coupled to a monitoring voltage $V_{MON}$. The monitoring voltage $V_{MON}$ is generated based on a current $I_{MON}$ that flows through the control transistor $N_C$ and through a monitoring resistor $R_{MON}$ that can be externally coupled between one of the pins of the sense controller 14 and a low-voltage rail, demonstrated in the example of FIG. 1 as ground. Therefore, the monitoring voltage $V_{MON}$ can be associated with an amplitude of the sense voltage $V_{SNS}$, and thus the amplitude of the output current $I_{OUT}$.

The monitoring voltage $V_{MON}$ is provided to a first input of a transconductance amplifier 20 that likewise receives a predetermined reference voltage $V_{REF}$ at a second input. While the example of FIG. 1 demonstrates that the predetermined reference voltage $V_{REF}$ is provided via a pin 16, it is to be understood that the $V_{REF}$ can be generated internally with respect to the IC that includes the sense controller 14. Therefore, the transconductance amplifier 20 compares the amplitude of the monitoring voltage $V_{MON}$ and the reference voltage $V_{REF}$ to generate a control voltage $V_C$ that is provided to a gate of the power transistor $N_P$. The power transistor $N_P$ can thus be controlled to maintain the amplitude of the output current $I_{OUT}$ at an amplitude that is based on the sense voltage $V_{SNS}$. Accordingly, the output current $I_{OUT}$ can be maintained at a controlled amplitude to limit inrush current in response to a hot plug-in or unplug of the load from the hot-swap system.

The chopper amplifier system 18 is configured to modulate and demodulate the differential sense voltage $V_{SNS1}$ and $V_{SNS2}$ at a chopping frequency to amplify the sense voltage $V_{SNS1}$ and $V_{SNS2}$ at a very low offset to provide the amplified voltage $V_{CH}$ as a continuous time output voltage (e.g., as against auto-zero). As an example, the chopper amplifier system 18 can include a multipath nested Miller compensation (MNMC) configuration. Thus, as opposed to other types of feedback amplifier arrangements, the chopper amplifier system 18 can implement low offset without requiring offset trimming, which can require additional time and accuracy testing. Additionally, it can be very difficult to achieve sufficient offset trimming across wide ranges of temperature and supply voltage by utilizing offset trimming in a typical non-chopping amplifier implementation. Therefore, the chopper amplifier system 18 can provide the very low offset to provide the amplified voltage $V_{CH}$ in a very accurate and time-efficient manner over wide ranges of temperature and supply voltage.

While a chopping amplifier can implement a very low offset for amplifying an input signal to provide an output signal, a typical chopping amplifier can also introduce an offset ripple in the output signal based on the switching of the offset in the chopping amplifier. To substantially mitigate an offset ripple in the amplified voltage $V_{CH}$, the chopper amplifier system 18 includes a notch filter chopping stage ("NOTCH FILTER") 22 arranged to filter out signal ripple in the chopper amplifier system 18. As an example, the notch filter chopping stage 22 can be arranged in a forward path of the chopper amplifier system 18, and can thus substantially filter out deleterious ripple effects from the amplified voltage $V_{CH}$.

The notch filter chopping stage 22 can limit the unity-gain bandwidth of the hot-swap control system 10. For example, the unity-gain bandwidth of the hot-swap control system 10 can be substantially low for a low chopping frequency of the clock signal that implements the switching in the chopper amplifier system 18. The unity-gain bandwidth of the hot-swap control system 10 can be increased by implementing a higher chopping frequency of the associated clock signal, but such higher chopping frequency of the associated clock signal can cause oscillations of the amplified voltage $V_{CH}$. For example, for a chopping frequency of approximately 1 MHz, can result in a unity-gain bandwidth of approximately 3 MHz, with any additional increase in the chopping frequency resulting in undesirable oscillations of the amplified voltage $V_{CH}$.

In the example of FIG. 1, the notch filter chopping stage 22 includes a capacitive compensation network 24. As an example, the capacitive compensation network 24 can be arranged as a plurality of capacitive compensation paths between the notch filter chopping stage 22 and the output of the chopper amplifier system 18. The capacitive compensation network 24 can thus provide frequency compensation with respect to the notch filter chopping stage 22. However, while the notch filter chopping stage 22 provides the benefit of filtering detrimental ripple from the amplified voltage $V_{CH}$, the notch filter chopping stage 22 can introduce a phase-lag in the separate respective capacitive compensation paths of the capacitive compensation network 24 relative to each other. Increasing the chopping frequency of the chopper amplifier stage 20 can decrease the phase-lag, but also increase the offset of the chopper amplifier system 18 and reduce the input impedance of the chopper amplifier system 18.

Therefore, as described herein, the capacitive compensation network 24 can be tuned with respect to capacitance values of an inner feedback path (e.g., loop) and an outer feedback path (e.g., loop) of the notch filter chopping stage 22 to provide unity-gain stability-compensation of the chopper amplifier system 18. As described herein, the term "unity-gain stability-compensation" with respect to the chopper amplifier system 18 describes providing stability of the transfer function of the chopper amplifier system 18, with respect to an inner-loop of the notch filter chopping stage 22 corresponding to a separate respective capacitive compensation path, as described in greater detail herein, that has been caused to be unstable by the phase-lag of the separate respective capacitive compensation paths of the capacitive compensation network 24 from the unity-gain bandwidth of the chopper amplifier system 18. Therefore, as described herein, "providing unity-gain stability-compensation" with respect to the chopper amplifier system 18 describes increasing the stable unity-gain bandwidth of the chopper amplifier system 18 without unduly increasing the chopping frequency of the chopper amplifier system 18. As described herein, "providing unity-gain stability-compensation" with respect to the chopper amplifier system 18 is accomplished by tuning a ratio of capacitance values of a first capacitor and a second capacitor arranged in separate respective feedback paths with respect to the notch filter chopping stage. Accordingly, the unity-gain stability-compensation can increase the unity-gain bandwidth of the of the hot-swap control system 10 for a given frequency of the clock signal that implements the switching of the chopper amplifier system 18 without undesirably inducing oscillations of the amplified voltage $V_{CH}$, and thus the output current $I_{OUT}$. Therefore, the tuning of the capacitive compensation network 24 to provide unity-gain stability-compensation of the chopper amplifier system 18 stabilizes the unity-gain bandwidth of the chopper amplifier system 18.

Figure 2:
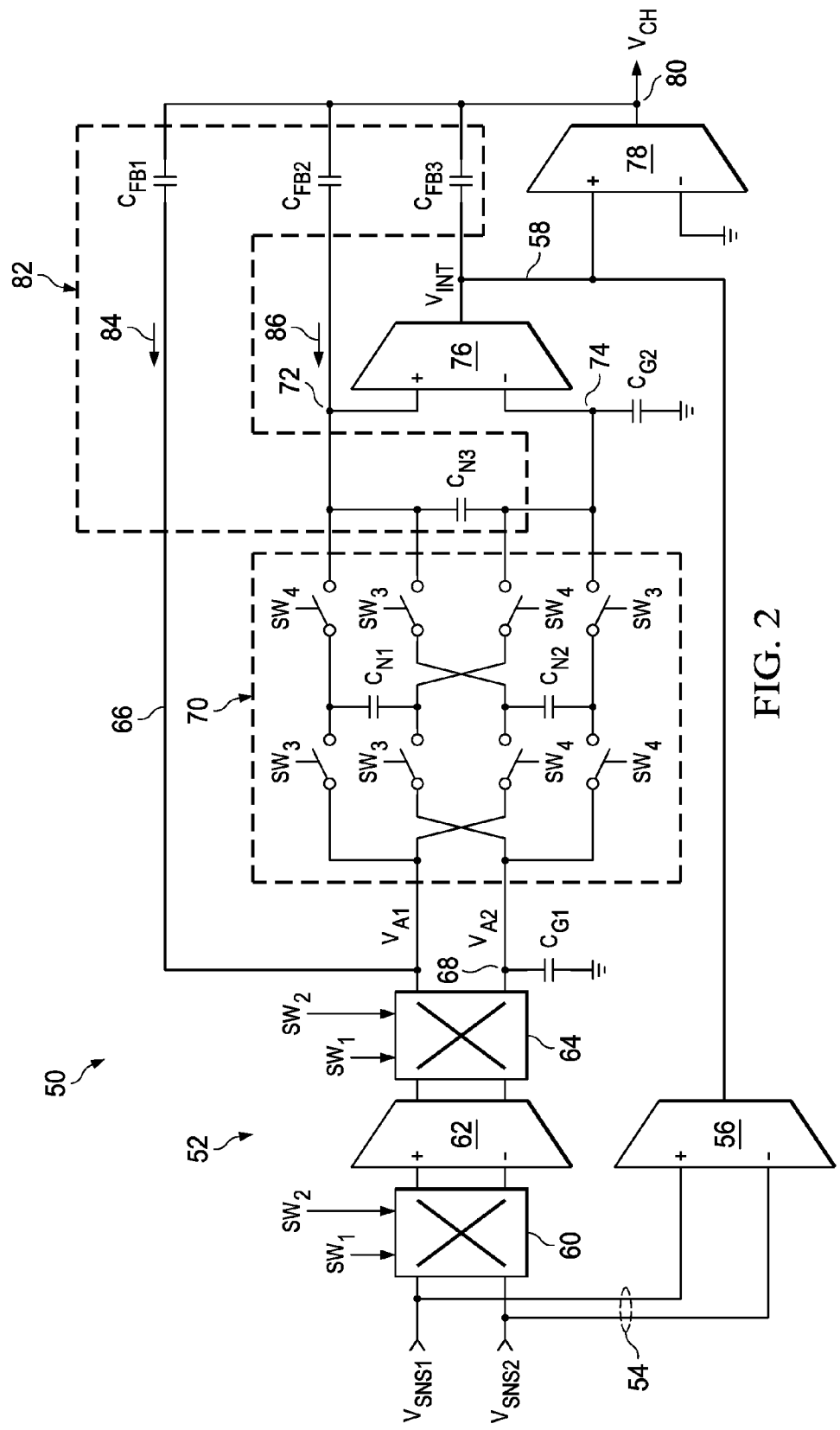
FIG. 2 illustrates an example of a chopper amplifier system.

FIG. 2 illustrates an example of a chopper amplifier system 50. The chopper amplifier system 50 can be implemented in a variety of applications to amplify an input voltage, demonstrated in the example of FIG. 2 as a differential input voltage $V_{SNS1}$ and $V_{SNS2}$, to provide an output signal, demonstrated in the example of FIG. 2 as an amplified voltage $V_{CH}$. As an example, the chopper amplifier system 50 can correspond to the chopper amplifier system 18 in the example of FIG. 1, and thus implements frequency chopping to provide amplification of the differential input voltage $V_{SNS1}$ and $V_{SNS2}$ to generate the amplified voltage $V_{CH}$ with unity-gain stability-compensation. As an example, the chopper amplifier system 50 can be implemented in or in part of an IC chip of the sense controller 14.

Figure 3:
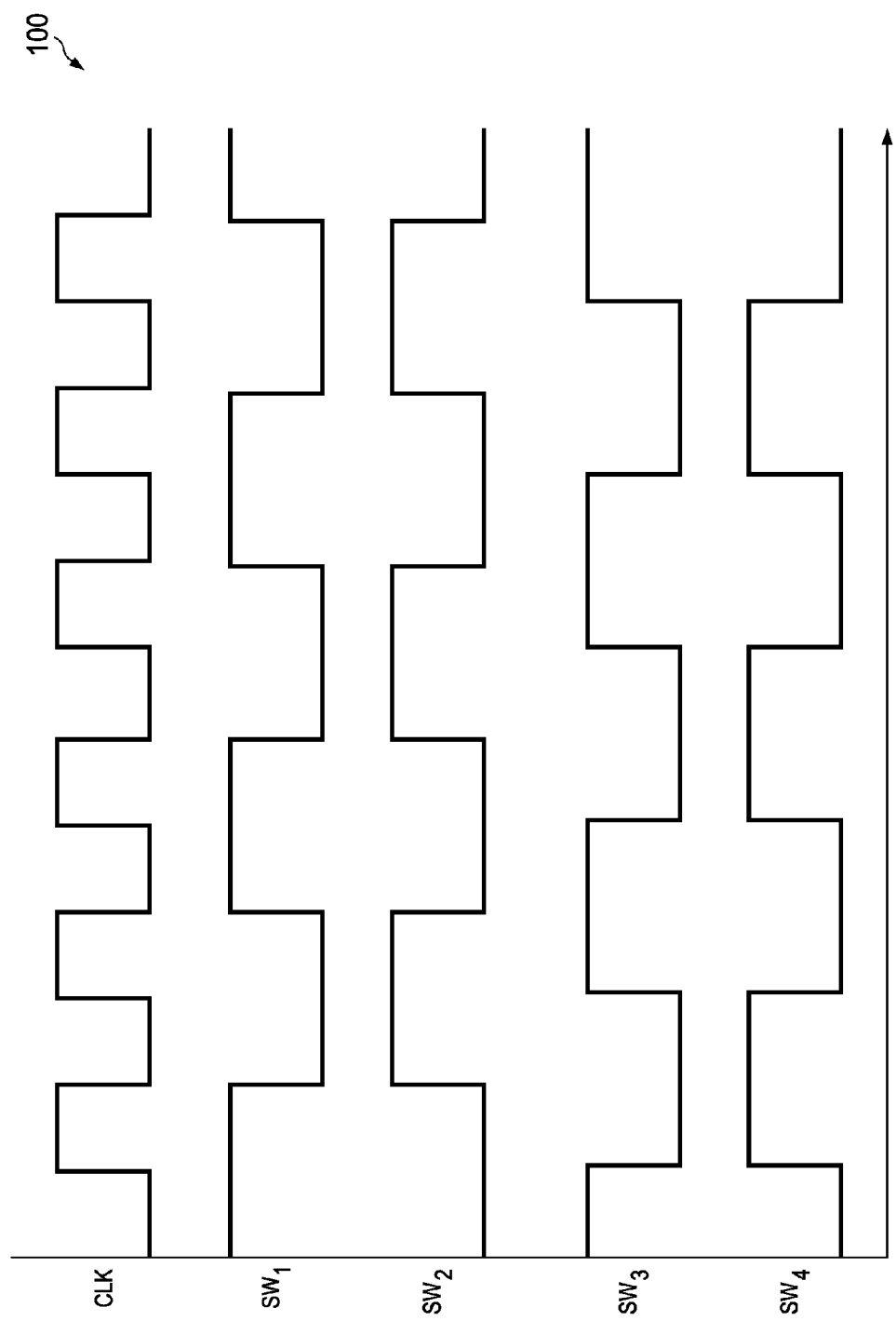
FIG. 3 illustrates an example of a timing diagram.

The chopper amplifier system 50 includes a forward path 52 and a feedforward path 54 that each receives the differential input voltage $V_{SNS1}$ and $V_{SNS2}$. In the feedforward path 54, the differential input voltage $V_{SNS1}$ and $V_{SNS2}$ are provided to a transconductance amplifier 56 that has an output coupled to an intermediate node 58. In the forward path 52, the differential input voltage $V_{SNS1}$ and $V_{SNS2}$ are provided to a first chopper stage 60 that is controlled by a first switching signal $SW_1$ and a second switching signal $SW_2$ that are complements (e.g., 180° out-of-phase) of each other, as indicated by the timing diagram 100 in the example of FIG. 3. The chopped differential input voltage $V_{SNS1}$ and $V_{SNS2}$ are provided to a transconductance amplifier 62 to be amplified before being provided to a second chopper stage 64. Therefore, the first chopper stage 60 is configured to alternately change the signal paths of the differential input voltage $V_{SNS1}$ and $V_{SNS2}$ through the transconductance amplifier 62 before being switched back by the second chopper stage 64. The chopped and amplified differential input voltage $V_{SNS1}$ and $V_{SNS2}$ are provided to a first feedback node 66 and a node 68, separated from ground via a capacitor $C_{G1}$, as respective voltages $V_{A1}$ and $V_{A2}$.

In the example of FIG. 2, the chopper amplifier system 50 includes a notch filter chopping stage 70 includes a plurality of switches that are respectively controlled by a third switching signal $SW_3$ and a fourth switching signal $SW_4$, and includes a first capacitor $C_{N1}$ and a second capacitor $C_{N2}$ between the respective sets of switches. The third and fourth switching signals $SW_3$ and $SW_4$ are complements (e.g., 180° out-of-phase) of each other, and are also 90° out-of-phase of the first and switching signals $SW_1$ and $SW_2$, as indicated by the timing diagram 100 in the example of FIG. 3. The notch filter chopping stage 70 thus provides the chopped voltages $V_{A1}$ and $V_{A2}$ at a second feedback node 72 and a node 74 separated from ground via a capacitor $C_{G2}$, respectively, that are separated by a capacitor $C_{N3}$ and are provided to respective inputs of a transconductance amplifier 76. The transconductance amplifier 76, along with the transconductance amplifier 56, provides an intermediate voltage $V_{INT}$ on the intermediate node 58 that is provided to an output transconductance amplifier 78 that is configured to generate the amplified voltage $V_{CH}$ on an output node 80 based on the intermediate voltage $V_{INT}$ at a first input and ground at a second input.

In the example of FIG. 2, the output node 80 is coupled to a capacitive compensation network 82. The capacitive compensation network 82 includes the capacitor $C_{N3}$, a first feedback capacitor $C_{FB1}$, a second feedback capacitor $C_{FB2}$, and a third feedback capacitor $C_{FB3}$. The output node 80 is coupled to the first feedback node 66 via the first feedback capacitor $C_{FB1}$, to the second feedback node 72 via the second feedback capacitor CB2, and to the intermediate node 58 via the third feedback capacitor $C_{FB3}$. The capacitive compensation network 82 can thus correspond to the capacitive compensation network 24 in the example of FIG. 1, and thus configured to provide frequency compensation of the chopper amplifier system 50.

In the example of FIG. 2, with respect to the input of the transconductance amplifier 76, the first feedback node 66 is part of a first feedback path, demonstrated at 84, and the second feedback path 72 is part of a second feedback path, demonstrated at 86. The first feedback path 84 thus includes the output node 80, the first feedback capacitor $C_{FB1}$, the notch filter chopping stage 70, and the second feedback node 66. The second feedback path 86 thus includes the output node 80, the second feedback capacitor $C_{FB2}$, and the second feedback node 66. While the first feedback path 84 provides Miller compensation for the transconductance amplifier 62, the second feedback path 86 is provided as an inner-loop beta network with respect to the transconductance amplifier 76. However, because of the path-delay of the first feedback path 84 and the separate respective path-delay of the second feedback path 86 based on the notch filter chopping stage 70, the net path-delay can introduce a phase-lag in the inner-loop beta network of the chopper amplifier system 50 that can cause instability at the output node 80, and thus an unstable amplified voltage $V_{CH}$. Accordingly, the capacitive compensation network 82 can be tuned to substantially reduce the first and second feedback paths 84 and 86, such as by increasing the second feedback path 86. In other words, by tuning the capacitive compensation network 82, the net path-delay can be reduced to provide sufficient phase-margin, such as a minimum phase-margin of about 45°.

As an example, the second feedback path 86 (e.g., inner-loop beta network) can have a unity-gain bandwidth that is defined $g_{m1}/C_{FB3}$, and can have a beta network formed from the first and second feedback paths 84 and 86, with the first feedback path 84 having a delay $\phi$ relative to the second feedback path 86 that is defined as:

$$\phi = \omega * \tau \qquad \text{Equation 1}$$

Where: $\tau = CLK/2$;
CLK corresponds to a clock signal associated with the switching signals $SW_1$, $SW_2$, $SW_3$, and $SW_4$, as demonstrated in the example of FIG. 3; and
$\omega$ is a frequency of the clock signal CLK.

Therefore, given an example delay of the notch filter chopping stage 70 of approximately one-half of a cycle of the clock signal CLK, a feedback sum $FB_{NET}$ of the first and second feedback paths 84 and 86 at the second feedback node 72 can be expressed as:

$$FB_{NET} = (a_1^2 + a_2^2 + 2*a_1*a_2*\cos\phi)^{1/2} \qquad \text{Equation 2}$$

$$a_1 = C_{FB1}/C_{N3} \qquad \text{Equation 2}$$

$$a_2 = C_{FB2}/C_{N3} \qquad \text{Equation 3}$$

Where: $a_1$ is a gain of the first feedback path 84; and
$a_2$ is a gain of the second feedback path 86.

Therefore, if the capacitance value of the capacitor $C_{N3}$ is significantly greater than the capacitance values of $C_{FB1}$ and $C_{FB2}$, then Equations 3 and 4 can be expressed as:

$$a_2/a_1 = C_{FB2}/C_{FB1} \qquad \text{Equation 5}$$

Additionally, a phase-shift $PS_{NET}$ of the first and second feedback paths 84 and 86 at the second feedback node 72 can be expressed as:

$$PS_{NET} = \tan^{-1}[a_1*\sin\phi/(a_1*\cos\phi + a_2)] \qquad \text{Equation 6}$$

Therefore, to achieve a phase-margin of approximately 45°, Equation 6 can be modified as:

$$a_1*\sin\phi/(a_1*\cos\phi + a_2) = 1 \qquad \text{Equation 7}$$

$$a_2/a_1 = \sin\phi - \cos\phi \qquad \text{Equation 8}$$

Therefore, for a minimum phase-margin of approximately 45°, Equations 5 and 8 can be combined as:

$$C_{FB2}/C_{FB1} = \sin\phi - \cos\phi \qquad \text{Equation 9}$$

Because the effective Miller capacitance of the transconductance amplifier 62 is based on the sum of the capacitance values of $C_{FB1}$ and $C_{FB2}$, the unity-gain bandwidth $UGB_{FBP1}$ of the first feedback path 84 can be expressed as:

$$UGB_{FBP1} = g_{m1}/(C_{FB1} + C_{FB2}) \qquad \text{Equation 10}$$

Therefore, as demonstrated by Equations 1-10, the capacitance value of $C_{FB2}$ of the chopper amplifier system 50 can be set at a much higher value than in typical chopper amplifier systems in hot-swap control system applications to achieve stable operation at high-gain operation. As an example, based on the operation of the notch filter chopping stage 70, the capacitance of the capacitor $C_{FB1}$ can be greatly diminished, causing a pole-zero pair near the notch frequency of the notch filter chopping stage 70. If the pole-zero pair is within an outer-loop a-beta of the overall chopper amplifier system 50, the chopper amplifier system 50 can experience undesirable settling behavior. However, by tuning the ratio of the capacitors $C_{FB2}/C_{FB1}$ (e.g., to approximately 0.5), the chopper amplifier system 50 can operate in a stable manner over the unity-gain bandwidth (e.g., with an inner-loop beta of approximately 350 kHz). As an example, the ratio of the capacitors $C_{FB2}/C_{FB1}$ can be increased to achieve greater bandwidths, or decreased to achieve a greater minimum closed-loop gain, with respect to the chopper amplifier system 50. Accordingly, the capacitors $C_{FB2}/C_{FB1}$ can be tuned to provide unity-gain stability-compensation of the chopper amplifier system 50, thus stabilizing the unity-gain bandwidth of the chopper amplifier system 50. Additionally or alternatively, the capacitance value of the capacitor $C_{N3}$ can be increased to substantially improve the stability of the second feedback path 86 based on the bandwidth of the capacitor $C_{N3}$ being reduced due to an inner-loop beta factor.

As described previously, tuning the capacitors $C_{FB2}/C_{FB1}$ can improve the unity-gain stability for the chopper amplifier system 50 for high gain applications of the hot-swap control system 10. Referring back to the example of FIG. 1, as also described previously, the sense resistor $R_{SNS}$ of the sense resistor network 12 can have a resistance value that is selected to be very small to provide the sense voltage $V_{SNS}$ at a very small amplitude (e.g., approximately 10 mV). Such an amplitude can result in the high gain to facilitate the unity-gain stability for the chopper amplifier system 18. However, the resistance value of the resistor $R_{SNS}$ may be fixed at a higher value (e.g., ten or more mΩ, such as 20 mΩ), such as based on previous specifications in a hot-swap system that incorporates the hot-swap control system 10 (e.g., that receives an IC chip that includes the sense controller 14). As a result, the sense voltage $V_{SNS}$ can be significantly greater, and thus requiring the chopper amplifier system 18 to operate at a low gain (e.g., $I_{MON}$-to-$V_{SNS}$ gain of less than 10). Therefore, the closed-loop bandwidth of the chopper amplifier system 18 can be very high, thus forcing the chopper amplifier system 18 to operate outside of the unity-gain bandwidth in an unstable manner.

Accordingly, the stability compensation resistor $R_{STB}$ can be added to the sense resistor network 12 to implement low closed-loop gain stability of the chopper amplifier system 18 (e.g., the chopper amplifier system 50). As described herein, the term "low closed-loop gain stability" with respect to the chopper amplifier system 18 describes implementing unity-gain stability in a low closed-loop gain environment of the chopper amplifier system 18 (e.g., $I_{MON}$-to-$V_{SNS}$ gain of less than 10). For example, the resistance value of the stability compensation resistor $R_{STB}$ can be selected to provide a closed-loop gain $A_{VCL}$ of the chopper amplifier system 18 of greater than ten based on the resistance values of the gain set resistor $R_{SET}$ and the monitoring resistor $R_{MON}$. For instance, the stability compensation resistor $R_{STB}$ can have a resistance value that is selected such that the closed-loop gain of the chopper amplifier system is approximately equal to a resistance of the monitoring resistor $R_{MON}$ divided by an equivalent parallel resistance of the gain set resistor $R_{SET}$ and the stability compensation resistor $R_{STB}$, provided as follows:

$$A_{VCL}=R_{MON}/(R_{STB}\|R_{SET}) \quad \text{Equation 11}$$

Where: $A_{VCL}>10$.

As a result, the stability compensation resistor $R_{STB}$ can decrease the beta the chopper amplifier system 18 to provide the low closed-loop gain stability of the chopper amplifier system 18. Additionally, the inclusion of the stability compensation resistor $R_{STB}$ does not affect the gain of the amplified voltage $V_{CH}$, and thus maintains accuracy of the control of the output current $I_{OUT}$. Furthermore, while the input-referred offset of the chopper amplifier system 18 may increase based on the larger gain with respect to the offset of the chopper amplifier system 18, the higher amplitude of the sense voltage $V_{SNS}$ mitigates any deleterious effects of the increased input-referred offset. Accordingly, the inclusion of the stability compensation resistor $R_{STB}$ can be effective to allow the chopper amplifier system 18 to provide unity-gain bandwidth stability at substantially any gain based on the tuning of the capacitive compensation network 24.

As described previously, the amplified voltage $V_{CH}$ is compared with a predetermined reference voltage $V_{REF}$ to provide the control voltage $V_C$ that controls the power transistor $N_P$, and thus the amplitude of the output current $I_{OUT}$. The reference voltage $V_{REF}$ can be selected at an amplitude that is associated with a desired amount of constant current amplitude of the output current $I_{OUT}$. However, at startup of the hot-swap control system 10 or for a variety of other reasons, it may be necessary to provide a more controlled (e.g., gradual) increase of the control voltage $V_C$, and thus control of the power transistor $N_P$. Therefore, in the example of FIG. 1, the hot-swap control system 10 includes a capacitive coupling 26 between the gate and the source of the power transistor $N_P$. The capacitive coupling 26 includes a capacitor $C_C$ and a resistor $R_C$ that are arranged in a series path between the gate and the source of the power transistor $N_P$. As described herein, the capacitive coupling 26 is configured to limit the unity-gain bandwidth associated with the hot-swap control system 10 to substantially increase stability associated with the chopper amplifier system 18.

The capacitive coupling 26 can provide an effective additional capacitance to the gate-capacitance of the power transistor $N_P$. As an example, the gate-capacitance of the power transistor $N_P$ can affect the bandwidth of the hot-swap control system 10. If the gate-capacitance of the power transistor $N_P$ is small, such as for a relatively small power transistor $N_P$, the bandwidth of the hot-swap control system 10 may be large enough to result in a pole caused by the chopper amplifier system 18, having a closed-loop gain (e.g., the gain from the sense voltage $V_{SNS}$ to the monitoring voltage $V_{MON}$), to move into the unity-gain bandwidth of the hot-swap control system 10. As a result of the pole moving into the unity-gain bandwidth of the hot-swap control system 10, phase-margin degradation can occur. Thus, by adding additional capacitance to the output of the transconductance amplifier 20, the unity-gain bandwidth of the hot-swap control system 10 can be limited to substantially mitigate phase-margin degradation, and thus maintain stability of the hot-swap control system 10. Therefore, as described herein, the phrase "substantially increase stability" with respect to the hot-swap control system 10 describes limiting the unity-gain bandwidth to remove the pole caused by the chopper amplifier system 18 from the unity-gain bandwidth to substantially mitigate phase-margin degradation, and thus maintain stability of the hot-swap control system 10.

As an example, at an initial startup of the hot-swap control system 10, the control voltage $V_C$ begins to charge the gate of the power transistor $N_P$ as the servo loop arrangement of the hot-swap control system 10 attempts to catch-up to the increase of the output current $I_{OUT}$. However, if the capacitance at the gate of the power transistor $N_P$ was coupled to ground, because the transconductance amplifier 20 requires a voltage difference between the monitoring voltage $V_{MON}$ and the reference voltage $V_{REF}$ to provide a sufficient current $I_C$ at the output, the current $I_C$ would have an error amplitude resulting in the power transistor $N_P$ being controlled at a decreased setpoint. Therefore, the amplitude of the output current $I_{OUT}$ would be undesirably decreased.

For example, based on the coupling of a load capacitance $C_L$ and a load resistance $R_L$, during an initial power-up with an output voltage $V_{OUT}$ with respect to the load resistance $R_L$ increasing, the current error can be calculated as follows. The control voltage $V_C$ follows the output voltage $V_{OUT}$, hence the transconductance amplifier 20 needs to charge the net capacitance at the gate of the power transistor $N_P$ via the control voltage $V_C$. Therefore, the transconductance amplifier 20 can provide a charging current $I_C$ as follows:

$$I_C=C_{NET}*dV/dt \quad \text{Equation 12}$$

Where: $C_{NET}$ is the effective net capacitance at the output of the transconductance amplifier 20, which is primarily dictated by the gate-drain capacitance $C_{GD}$ of the power transistor NP (e.g., $C_{NET}\approx C_{GD}$).

The charging current $I_C$ would need an error voltage dV at the input of the transconductance amplifier 20 that is provided as:

$$dV=I_C/gm_2 \quad \text{Equation 13}$$

Where: $gm_2$ is the transconductance value of the transconductance amplifier 20.

Thus, the error ratio $\Delta I/I_{OUT}$ of the output current $I_{OUT}$ can be expressed as:

$$\Delta I/I_{OUT}=C_{GD}/gm_2*I_{OUT\_MAX}/C_1/V_{REF} \quad \text{Equation 14}$$

Therefore, as opposed to a capacitive connection to ground, as provided in servo arrangements in typical hot-swap control systems, the hot-swap control system 10 provides the capacitive coupling 26 between the gate and source of the power transistor $N_P$ of the capacitor $C_C$ and the resistor $R_C$ (e.g., having a resistance of 1 kΩ). The gate-source capacitance of the power transistor $N_P$ only affects the high frequency gain of the hot-swap control system 10 when the source-follower effect of the servo arrangement of the hot-swap control system 10 is diminished by the output capacitance loading. Therefore, the capacitive coupling 26 does not cause the output current $I_{OUT}$ to slew and does not cause an error in the amplitude of the current $I_C$ based on a voltage difference at the input of the transconductance amplifier 20. Additionally, at frequencies where the unity-gain bandwidth and/or the phase-margin is affected, the capacitive coupling 26 limits the bandwidth. Accordingly, the capacitive coupling 26 between the gate and the source of the power transistor $N_P$ can limit the loop bandwidth to provide stability while maintaining accuracy.

For example, the capacitance value of the capacitor $C_C$ can be calculated as follows. Absent the capacitor $C_C$, in the example of FIG. 1, assuming the coupling of the load capacitance $C_L$ and the load resistance $R_L$, the hot-swap control system 10 can be modeled in two stages. A first stage can be associated with the transconductance amplifier 20, and a second stage can be associated with the sense resistor network 12, the chopper amplifier system 18, and the power transistor $N_P$. At lower frequencies, the first stage is loaded by a parasitic drain-gate capacitance $C_{GD}$ of the power transistor $N_P$, but at higher frequencies, is additionally loaded by a reflected parasitic gate-source capacitance $C_{GS}$ of the power transistor $N_P$ (e.g., with the parasitic gate-source capacitance $C_{GS}$ being much greater than the parasitic drain-gate capacitance $C_{GD}$).

The second stage is arranged as a source-follower, such that the power transistor $N_P$ has a transconductance $gm_0$ and such that the gain $A_{V1}$ of the chopper amplifier system 18 is modeled as ideal. The second stage can experience a zero at a frequency of zero based on the load capacitance $C_L$, and a pole at $gm_0/C_L$ based on the source-follower output impedance. Additionally, at the $gm_0/C_L$ frequency, the reflected gate-source capacitance $C_{GS}$ can be loaded by the transconductance $gm_2$ of the transconductance amplifier 20 based on the output current $I_{OUT}$ no longer tracking the control voltage $V_C$. However, at higher frequencies, the load capacitance $C_L$ can act as a short-circuit, and thus reflects the full gate-source capacitance $C_{GS}$ onto the transconductance $gm_2$, and the beta factor $\beta$ can be expressed as follows:

$$\beta = R_{SNS} * gm_0 * A_{V1} \quad \text{Equation 15}$$

Thus, the loop unity-gain bandwidth $UGB_L$ of the source-follower arrangement of the second stage can be expressed as:

$$UGB_L = gm_2/C_{GS} * A_{V1} * R_{SNS} * gm_0 \quad \text{Equation 16}$$

$$A_{V1} = R_{MON}/R_{SET} \quad \text{Equation 17}$$

$$UGB_L = gm_2/C_{GS} * R_{MON}/R_{SET} * R_{SNS} * gm_0 \quad \text{Equation 18}$$

The pole $f_{CP}$ that occurs due to the chopper amplifier system 18 can be expressed as follows:

$$f_{CP} = UGB_C/A_{V1} = UGB_C * R_{SET}/R_{MON} \quad \text{Equation 19}$$

Where: $UGB_C$ is the open-loop unity-gain bandwidth of the chopper amplifier system 18.

For stable operation of the hot-swap control system 10, the pole $f_{CP}$ is greater than or equal to the loop unity-gain bandwidth $UGB_L$. Therefore, from Equations 18 and 19:

$$UGB_C * R_{SET}/R_{MON} \geq gm_2/C_{GS} * R_{MON}/R_{SET} * R_{SNS} * gm_0 \quad \text{Equation 20}$$

$$C_{MIN} = gm_2/UGB_C * R_{MON}^2/R_{SET}^2 * R_{SNS} * gm_0 \quad \text{Equation 21}$$

Where: $C_{MIN}$ is a minimum gate-source capacitance of the power transistor N.

Therefore, if the calculated minimum gate-source capacitance $C_{MIN}$ of the power transistor $N_P$ is insufficient for stable operation of the hot-swap control system 10, then the capacitor $C_C$ is added to provide sufficient minimum gate-source capacitance $C_{MIN}$ of the power transistor $N_P$. Thus, the capacitor $C_C$ can have a capacitance value as follows:

$$C_C = C_{MIN} - C_{GS} \quad \text{Equation 22}$$

Accordingly, the capacitive coupling provided by the capacitor $C_C$ between the gate and the source of the power transistor $N_P$ can limit the loop bandwidth to provide stability while maintaining accuracy of the output current $I_{OUT}$ based on the control voltage $V_C$.

What have been described above are examples of the invention. It is, of course, not possible to describe every conceivable combination of components or method for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A hot-swap control system comprising:
   a sense resistor network configured to provide a sense voltage in response to an output current;
   a sense control circuit comprising a chopper amplifier system arranged in a servo feedback arrangement to generate a monitoring voltage having an amplitude that is associated with an amplitude of the output current based on the sense voltage, the chopper amplifier system comprising a notch filter chopping stage arranged to filter out signal ripple in the chopper amplifier system and a capacitive compensation network arranged with respect to the notch filter chopping stage comprising a first capacitor and a second capacitor arranged in separate respective feedback paths with respect to the notch filter chopping stage and which have a ratio of capacitance values tuned to provide unity-gain stability-compensation of the chopper amplifier system, the sense control circuit further comprising a transconductance amplifier configured to compare the monitoring voltage with a predetermined reference voltage to generate a control voltage; and
   a power transistor configured to conduct the output current to an output based on the control voltage.

2. The system of claim 1, wherein the chopper amplifier system comprises a first input and a second input, wherein the sense resistor network comprises:
   a sense resistor arranged to conduct the output current to generate the sense voltage; and
   a stability compensation resistor interconnecting the first input and the second input and being configured to provide low closed-loop gain stability of the chopper amplifier system.

3. The system of claim 2, wherein the sense resistor interconnects the first input and a first node, the sense resistor network further comprising a gain set resistor interconnecting the first node and the second input.

4. The system of claim 2, wherein the stability compensation resistor has a resistance value that is selected to provide a closed-loop gain of the chopper amplifier system of greater than ten.

5. The system of claim 4, wherein the sense resistor network further comprises a gain set resistor that interconnects the sense resistor and the stability compensation resistor, the system further comprising a monitoring resistor configured to generate the monitoring voltage based on an amplitude of a monitoring current that is generated via the chopper amplifier system, wherein the stability compensation resistor has a resistance value that is selected such that the closed-loop gain of the chopper amplifier system is approximately equal to a resistance of the monitoring resistor divided by an equivalent parallel resistance of the gain set resistor and the stability compensation resistor.

6. The system of claim 2, wherein the sense control circuit is arranged as an integrated circuit (IC) chip comprising a set of pins associated with the first input and the second input of the chopper amplifier system and being coupled to the stability compensation resistor.

7. The system of claim 1, wherein the power transistor comprises a control terminal that receives the control voltage and an output terminal from which the output current is provided to a load, the hot-swap control system further comprising a capacitive coupling between the control terminal and the output terminal.

8. The system of claim 7, wherein the capacitive coupling further comprises a resistor in series with a capacitor between the control terminal and the output terminal of the power transistor.

9. An integrated circuit (IC) chip comprising the sense control circuit of the system of claim 1, the IC chip comprising:
a set of sense pins coupled to the sense resistor network; and
a monitoring pin coupled to a second external resistor configured to generate the monitoring voltage based on an amplitude of a monitoring current that is generated via the chopper amplifier system.

10. The IC chip of claim 9, wherein the set of sense pins are interconnected by a stability compensation resistor having a resistance value that is selected to increase an effective closed-loop gain of the chopper amplifier system with respect to the sense voltage to a value of at least ten.

11. A hot-swap control system comprising:
a sense resistor network configured to provide a sense voltage in response to an output current;
a chopper amplifier system arranged in a servo feedback arrangement to generate a monitoring voltage having an amplitude that is associated with an amplitude of the output current based on the sense voltage;
a transconductance amplifier configured to compare the monitoring voltage with a predetermined reference voltage to generate a control voltage;
a power transistor configured to conduct the output current from an output terminal of the power transistor to an output based on the control voltage being provided to a control terminal of the power transistor; and
a capacitive coupling between the control terminal and the output terminal of the power transistor.

12. The system of claim 11, wherein the chopper amplifier system comprises:
a notch filter chopping stage arranged to filter out signal ripple in the chopper amplifier system across a unity-gain bandwidth of the chopper amplifier system; and
a capacitive compensation network arranged with respect to the notch filter chopping stage comprising a first capacitor and a second capacitor arranged in separate respective feedback paths with respect to the notch filter chopping stage and which have a ratio of capacitance values tuned to provide unity-gain stability-compensation of the chopper amplifier system.

13. The system of claim 11, wherein the chopper amplifier system comprises a first input and a second input, wherein the sense resistor network comprises:
a sense resistor interconnecting the first input and a first node and being configured to conduct the output current to generate the sense voltage;
a gain set resistor interconnecting the first node and the second input; and
a stability compensation resistor interconnecting the first input and the second input and having a resistance value that is selected to increase an effective closed-loop gain of the chopper amplifier system with respect to the sense voltage to a value of at least ten.

14. The system of claim 13, wherein the sense resistor network further comprises a gain set resistor that interconnects the sense resistor and the stability compensation resistor, the system further comprising a monitoring resistor configured to generate the monitoring voltage based on an amplitude of a monitoring current that is generated via the chopper amplifier system, wherein the stability compensation resistor has a resistance value that is selected such that a closed-loop gain of the chopper amplifier system defined by a resistance of the monitoring resistor divided by an equivalent parallel resistance of the gain set resistor and the stability compensation resistor is greater than ten.

15. The system of claim 13, wherein the capacitive coupling comprises a resistor in series with a capacitor between the control terminal and the output terminal of the power transistor.

16. The system of claim 11, wherein the chopper amplifier system and the transconductance amplifier system are arranged as a sense control integrated circuit (IC) chip.

17. An integrated circuit (IC) chip comprising:
a chopper amplifier system arranged in a servo feedback arrangement to generate a monitoring voltage having an amplitude that is associated with an amplitude of an output current based on a sense voltage, the chopper amplifier system comprising a capacitive compensation network arranged with respect to the notch filter chopping stage comprising a first capacitor and a second capacitor arranged in separate respective feedback paths with respect to the notch filter chopping stage and which have a ratio of capacitance values tuned to provide unity-gain stability-compensation of the chopper amplifier system, and further comprising a capacitive compensation network arranged with respect to the notch filter chopping stage to provide unity-gain stability-compensation of the chopper amplifier system;
a transconductance amplifier configured to compare the monitoring voltage with a predetermined reference voltage to generate a control voltage that is provided to control a power transistor to control an amplitude of the output current; and
a first sense pin and a second sense pin configured to facilitate coupling to an external sense resistor network configured to provide the sense voltage in response to the output current, the external sense resistor network comprising:
a sense resistor interconnecting the first sense pin and a first node and being configured to conduct the output current to generate the sense voltage;
a gain set resistor interconnecting the first node and the second sense pin; and
a stability compensation resistor interconnecting the first and second sense pins and having a resistance value that is selected to increase an effective closed-loop gain of the chopper amplifier system with respect to the sense voltage to a value of at least ten.

18. The system of claim 17, wherein the stability compensation resistor has a resistance value that is selected to provide a closed-loop gain of the chopper amplifier system of greater than ten.

19. The system of claim 17, further comprising a monitoring pin coupled to a monitoring resistor configured to generate the monitoring voltage based on an amplitude of a monitoring current that is generated via the chopper amplifier system, wherein the stability compensation resistor has a resistance value that is selected such that a closed-loop gain of the chopper amplifier system associated with a resistance of the monitoring resistor divided by an equivalent parallel resistance of the gain set resistor and the stability compensation resistor is approximately equal to ten.

20. The system of claim 17, wherein the power transistor comprises a control terminal that receives the control voltage and an output terminal from which the output current is provided to a load, the hot-swap control system further comprising a capacitive coupling between the control terminal and the output terminal.

* * * * *